United States Patent [19]
Sakata

[11] Patent Number: 6,108,395
[45] Date of Patent: Aug. 22, 2000

[54] REGISTER DEVICE

[75] Inventor: Toshikazu Sakata, Miyazaki-pref, Japan

[73] Assignee: Oki Electric Industry Co., Ltd., Tokyo, Japan

[21] Appl. No.: 09/123,433

[22] Filed: Jul. 28, 1998

[30] Foreign Application Priority Data

Feb. 10, 1998 [JP] Japan .................................. 10-046216

[51] Int. Cl.⁷ .................................................. G11C 19/00
[52] U.S. Cl. .................................................. 377/68; 377/81
[58] Field of Search .................................. 377/27, 54, 68, 377/77, 81

[56] References Cited

U.S. PATENT DOCUMENTS 4,473,760  9/1984  Ambrosius, III et al. ................. 377/81
4,649,512  3/1987  Nukiyama ................................. 377/66
4,833,655  5/1989  Wolf et al. ............................... 377/67

*Primary Examiner*—Margaret R. Wambach
*Attorney, Agent, or Firm*—Jones Volentine, L.L.C.

[57] ABSTRACT

A register device is provided with a plurality of sub-register devices. The plurality of sub-register devices are grouped into three sub-register device groups, with a signal processing unit constituted of inverters and a capacitative element provided between adjacent sub-register device groups. A transfer signal output by a transfer signal generator is amplified at the signal processing units. This structure achieves an accurate and efficient transfer of data within the sub-register devices from write register units to read register units.

15 Claims, 8 Drawing Sheets

REGISTER DEVICE

BACKGROUND OF THE INVENTION

1. Field of the Invention

The present invention relates to a register device which is employed in a semiconductor storage apparatus such as a FIFO memory to temporarily store data.

2. Description of the Background Art

A FIFO memory constituting field memory is required to be capable of operating at high speed and to have a large capacity in order to handle image data. Consequently, such a FIFO memory is provided with a dynamic memory cell with which high integration is possible and a register device constituted of a write data register and a read data register which temporarily stores specific data.

FIG. 8 illustrates a conventional FIFO memory 101. This FIFO memory 101 is provided with n data input terminals Din-1 through Din-n through which n sets of serial data are respectively input, for instance, and these data input terminals are connected with n data input buffers 111-1 through 111-n respectively. The data input buffers 111-1 through 111-n are circuits that are set in an active state when an H-level signal is input to a write enable terminal WE and input serial data provided through the data input terminals Din-1 through Din-n are respectively input to the data input buffers 111-1 through 111-2. In addition, the output terminals of the data input buffers 111-1 through 111-n are connected with a register device 121 via a write data bus WDB.

The register device 121, which has a function of temporarily storing data from the write data bus WDB, is constituted of n write register units 123-1 through 123-n and n read register units 125-1 through 125-n. The read register units 125-1 through 125-n are connected with a read data bus RDB.

The output terminals of the register device 121 are connected with n data registers 131-1 through 131-n. The data registers 131-1 through 131-n are circuits that are set in an active state when an H-level signal is input to the write enable terminal WE, store data from the register device 121 and output the data to n memory cell arrays 141-1 through 141-n respectively. Each of the memory cell arrays 141-1 through 141-n is provided with a plurality of word lines (not shown) and bit lines (not shown) and memory cells for data storage are arrayed at points where they intersect. It is to be noted that the selection of word lines is selected by an X decoder 142.

The memory cell arrays 141-1 through 141-n are connected with n data registers 151-1 through 151-n respectively. The data registers 151-1 through 151-n enter an active state when an H-level signal is input to the read enable terminal RE and have a function of storing data read out from the memory cell arrays 141-1 through 141-n respectively. The output terminals of the data registers 151-1 through 151-n are respectively connected with n data output buffers 161-1 through 161-n. In addition, the output buffers 161-1 through 161-n are also connected with the read data bus RDB. The data output buffers 161-1 through 161-n enter an active state when an H-level signal is input to the read enable terminal RE and have a function of inputting the data from the data registers 151-1 through 151-n respectively or the data from the read data bus RDB to output them to data output terminals Dout-1 through Dout-n respectively.

The FIFO memory 101 is further provided with a serial write timing control circuit 171 that controls the data write operation based upon a clock signal input through a serial write clock terminal SWCK, with its output terminal connected to a write reset control circuit 173 and the data registers 131-1 through 131-n. The output terminal of the write reset control circuit 173, which is a circuit for resetting the data write operation based upon a reset signal input through a reset write terminal RSTW, is connected to the data registers 131-1 through 131-n.

In addition, in correspondence to the serial write timing control circuit 171 and the write reset control circuit 173, a serial read timing control circuit 175 and a read reset control circuit 177 are respectively provided. The output terminal of the serial read timing control circuit 175, which is a circuit for controlling data read operation based upon a clock signal input through a serial read clock terminal SRCK, is connected to the read reset control circuit 177 and the data registers 151-1 through 151-n. The output terminal of the read reset control circuit 177 which is a circuit for resetting the data read operation based upon the reset signal input through a reset read terminal RSTR is connected to the data registers 151-1 through 151-n.

Furthermore, a clock oscillator 181 for generating a clock signal is provided at the FIFO memory 101, with its output terminal connected to a read/write/refresh control circuit 183. The read/write/refresh control circuit 183 implements read/write control and refresh control for the X decoder 142 based upon outputs from the clock oscillator 181 and the data registers 131-1 through 131-n and 151-1 through 151-n.

Next, the register device 121 provided in the FIFO memory 101 described above is explained in reference to FIG. 9.

The register device 121 is constituted of n sub-register devices SR-1 through SR-n having almost identical functions and structural features. The individual sub-register devices SR-1 through SR-n are respectively provided with the write register units 123-1 through 123-n and the read register units 125-1 through 125-n described earlier. It is to be noted that in this explanation, the sub-register device SR-1 is described as a typical example.

As illustrated in FIG. 9, the sub-register device SR-1 is provided with the write register unit 123-1 connected to the write data bus WDB and the read register unit 125-1 connected to the read data bus RDB. In addition, the write register unit 123-1 and the read register unit 125-1 are connected with each other through a data transfer gate TG constituted of two N channel type transistors.

The write register unit 123-1 is constituted of a write register WR for storing data from the write data bus WDB and a write pointer WP for connecting the write register WR with the write data bus WDB. It is to be noted that the write register WR is constituted of a so-called inverter latch that comprises two inverters. In addition, the write pointer WP is constituted of two N channel type transistors. The write pointers WP provided in the individual sub-register devices SR-1 through SR-n are sequentially set to an ON state by means for shifting such as a shift register (not shown) to connect the write registers WR provided at the individual sub-register devices SR-1 through SR-n with the write data bus WDB. Thus, specific data are sequentially written in the individual write registers WR.

The read register unit 125-1 comprises a read register RR for storing data transferred from the write register 123-1 and a read pointer RP for connecting the read register RR to the read data bus RDB. It is to be noted that the read register RR is constituted of a so-called inverter latch comprising two inverters as in the case with the write register WR. In addition, the read pointer RP is constituted of two N channel type transistors, as in the case with the write pointer WP. The read pointers RP provided at the individual sub-register devices SR-1 through SR-n are sequentially set to an ON state by a means for shifting such as a shift register (not shown) to connect the read registers RR provided at the individual sub-register devices SR-1 through SR-n with the read data bus RDB. As a result, the specific data stored at the individual read registers RR are sequentially output to the read data bus RDB.

In addition, the data transfer gate TG which connects the write register unit 123-1 and the read register unit 125-1 engages in an ON/OFF operation in response to a transfer signal ST provided by a transfer signal generating unit 191. The transfer signal generating circuit 191 outputs an H-level transfer signal ST at a point in time at which, for instance, all the read register units 123-1 through 123-n have completed a read operation and all the write register unit 125-1 through 125-n have completed a write operation, to set the data transfer gates TG provided in all the sub-register devices SR-1 through SR-n in an ON state.

Now, when the FIFO memory 101 is employed in processing a large volume of data, the number of sub-register devices SR-1 through SR-n in the register device 121 illustrated in FIG. 9 will be, for instance, approximately 70 through 100. In the register device 121 in the prior art provided with a large number of the sub-register devices SR-1 through SR-n as in this case, the transfer signal ST output by the transfer signal generating unit 191 may become attenuated while it travels from the sub-register device SR-n located closest to the transfer signal generating unit 191 to reach the sub-register device SR-1 located furthest from the transfer signal generating unit 191, as illustrated in FIG. 10, due to the influence of the capacity capacitative component and the like of the data transfer gates TG in the sub-register devices SR-1 through SR-n. Such attenuation of the transfer signal ST leads to a defective operation of the data transfer gates TG, which poses a problem that the data at the write register unit 123-1 may not be correctly transferred to the read register unit 125-1.

Furthermore, if the data stored at the write register units 123-1 through 123-n do not match the data stored at the corresponding read register units 125-1 through 125-n, all the inverters constituting the individual read registers RR will perform an inversion operation at once, which may result in a reduction in the source potential Vcc or an increase in the ground potential Gnd, as illustrated in FIG. 10. Large fluctuations in the source potential Vcc and the ground potential Gnd not only induce a defective operation of the transfer gates TG but also adversely affect the circuits other than the register device 121.

SUMMARY OF THE INVENTION

An object of the present invention, which has been completed by addressing the problems of the register device in the prior art discussed above, is to provide a new and improved register device which is capable of accurately and efficiently transferring data stored at the write register units to the read register units even when a large number of sub-register devices are provided.

Another object of the present invention is to provide a new and improved register device with which the source potential and the ground potential are affected to the smallest possible degree during such a data transfer.

In order to achieve the objects described above, according to the present invention, a register device including a plurality of sub-register devices each constituted of a first register unit, a second register unit and a data transfer unit which is capable of transferring data held at the first register unit to the second register unit, and a transfer signal generating unit that generates a transfer signal used for controlling the data transfer units at the plurality of sub-register devices, is provided. This register device is characterized in that a signal processing unit having a function of amplifying the transfer signal is provided at one location or two or more locations in a transmission path through which the transfer signal is transmitted to the individual sub-register devices.

Since the transfer signal is amplified at the signal processing unit provided at a specific location in the transmission path even when the number of sub-register devices increases with the length of the transmission path extended as a result, a stable transfer signal can be transmitted to the sub-register device located at the furthest end in this structure. Consequently, the data transfer from the first register units to the second register units in all the sub-register devices is performed correctly through error-free operation.

Furthermore, a means for signal delay that is capable of outputting a signal that has been input after delaying it by a specific length of time may be provided at the signal processing unit. This structure will make it possible to execute data transfer from the first register unit to the second register unit in each sub-register device with shifted timing. As a result, the level of momentary power consumption occurring during data transfer is reduced.

Moreover, a means for pulse signal generation that is capable of generating a pulse signal having a specific time width based upon input signal may be provided at the signal processing unit. Since this structure will make it possible to set the data transfer unit in an active state only for the length of time required for the transfer of data from the first register unit to the second register unit in each sub-register device, the power consumption required for the operation of the data transfer units can be reduced.

In addition, the register device described above may be constituted by grouping the plurality of sub-register devices into a plurality of sub-register device groups so that the transfer signal is sequentially transmitted to the individual sub-register device groups through the transmission path. By adopting this structure, it becomes possible to operate a plurality of sub-register devices with a high degree of efficiency.

Moreover, by providing the individual sub-register device groups in such a manner that the transfer signal is not transmitted continuously to adjacent sub-register device groups, the timing with which the sub-register devices in one sub-register device group start their operation will be offset from the timing with which the sub-register devices in an adjacent sub-register device group start their operation. As a result, even if a fluctuation in the source voltage occurs at a start of the operation of one sub-register device group, the degree to which this fluctuation affects the operation of the adjacent sub-register devices can be reduced.

BRIEF DESCRIPTION OF THE DRAWINGS

The above and other features of the invention and the concomitant advantages will be better understood and appreciated by persons skilled in the field to which the invention pertains in view of the following description given in conjunction with the accompanying drawings which illustrate preferred embodiments.

In the drawings.

DETAILED DESCRIPTION OF THE PREFERRED EMBODIMENTS

The following is a detailed explanation of the preferred embodiments of the register device according to the present invention in reference to the attached drawings. It is to be noted that in the following explanation, the same reference numbers are assigned to components having essentially identical functions and structural features to preclude the necessity for repeated explanation thereof.

Figure 1:
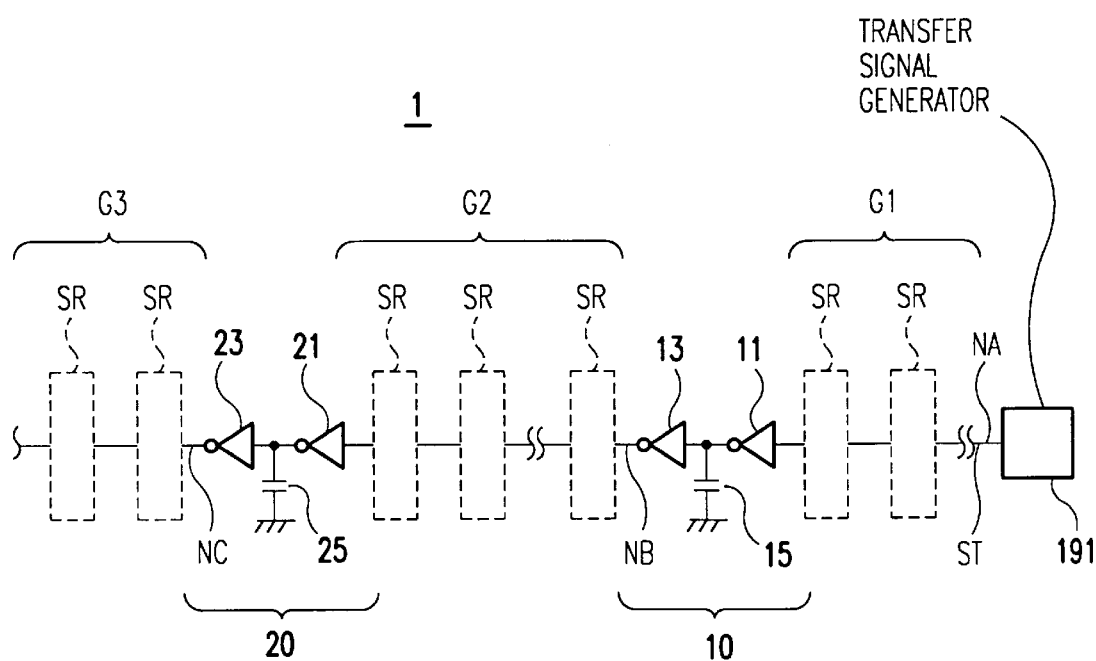
FIG. 1 is a circuit block diagram illustrating the structure of the register device in a first embodiment of the present invention.

The structure of a register device 1 in the first embodiment is illustrated in FIG. 1. This register device 1 is provided with a plurality of sub-register devices SR having structural features and functions practically identical to those of the sub-register devices SR-1 through SR-n in the register device 121 in the prior art. The plurality of sub-register devices SR are grouped into, for instance, three sub-register device groups G1, G2 and G3 with a signal processing unit 10 constituted of inverters 11 and 13 and a capacitative element 15 functioning as a means for signal delay provided between the sub-register device group G1 and the sub-register device group G2 and a signal processing unit 20 constituted of inverters 21 and 23 and a capacitative element 25 functioning as a signal delay element provided between the sub-register device group G2 and the sub-register device group G3.

At the signal processing unit 10, the output of the inverter 11 is commonly connected to the input of the inverter 13 and one end of the capacitative element 15 with another end of the capacitative element 15 grounded. Likewise, at the signal processing unit 20, the output of the inverter 21 is commonly connected to the input of the inverter 23 and one end of the capacitative element 25, with another end of the capacitative element 25 grounded.

Figure 2:
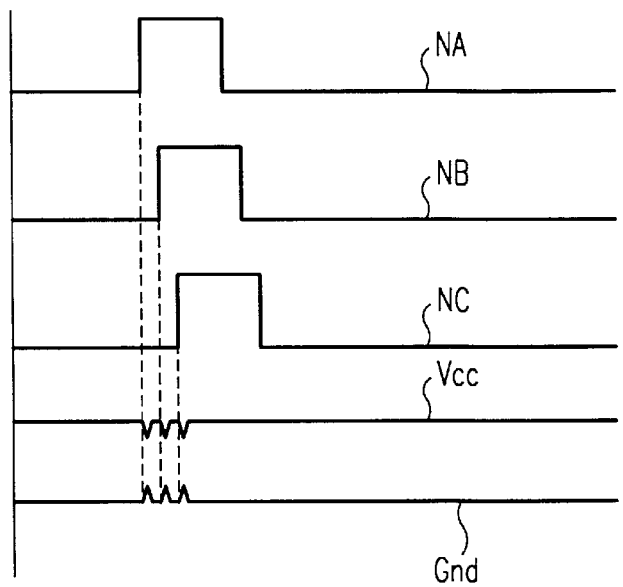
FIG. 2 is a waveform diagram illustrating the operation of the register device in FIG. 1.

Next, the operation of the register device 1 in the first embodiment is explained in reference to FIG. 2.

When the transfer signal ST output by the transfer signal generating unit 191 is set to L level, the data transfer gates TG functioning as data transfer units provided at the individual sub-register devices SR are in an OFF state, with the data stored at the write register units held instead of being transferred to the read register units.

At this point, the transfer signal ST shifts to H-level and is input to the sub-register device group G1 located closest to the transfer signal generating unit 191 via a node NA. This sets the data transfer gates TG of the sub-register devices SR constituting the sub-register device group G1 in an ON state to cause specific data to be transferred from the write register units to the read register units.

Next, this transfer signal ST at H-level is communicated to the signal processing unit 10. At the signal processing unit 10 which is provided with the capacitative element 15, the transfer signal ST that has been input is delayed by a specific length of time by the capacitative element 15 and then is communicated to a node NB. The transfer signal ST at the node NB is then input to the sub-register device group G2. The data transfer gates TG of the sub-register devices SR constituting the sub-register device group G2 are thus turned on so that specific data are transferred from the write register units to the read register units.

The transfer signal ST that has been communicated to the sub-register device group G2 is next input to the signal processing unit 20 where the transfer signal ST is delayed by a specific length of time in a manner similar to the manner in which it has been delayed at the signal processing unit 10, as explained earlier, to be communicated to a node NC. The transfer signal ST at the node NC is then input to the sub-register device group G3, and subsequently, the same procedure is repeated until the transfer signal ST is communicated to the sub-register device SR located at the last stage.

As explained above, since the register device 1 in the first embodiment is provided with the signal processing units 10 and 20 having the function of delaying the transfer signal ST located between the sub-register device groups G1 and G2 and between the sub-register device groups G2 and G3, the number of sub-register devices SR that perform a transfer operation of data from the write register units to the read register units at the same time is reduced. As a result, as illustrated in FIG. 2, fluctuations in the source potential Vcc and the ground potential Gnd can be minimized to stabilize the operations of peripheral circuits as well as the operation of the register device 1.

In addition, the signal processing units 10 and 20 are respectively provided with inverters 13 and 23 at their outputs to achieve amplification of the transfer signal ST. This makes it possible to communicate the transfer signal ST generated at the transfer signal generating unit 191 to the sub-register device SR located at furthest end without attenuation, even when the number of sub-register devices is increased. Consequently, with the register device 1 in the first embodiment, the number of sub-register devices SR can be increased with ease in correspondence to an increase in the volume of data to be handled.

Figure 3:
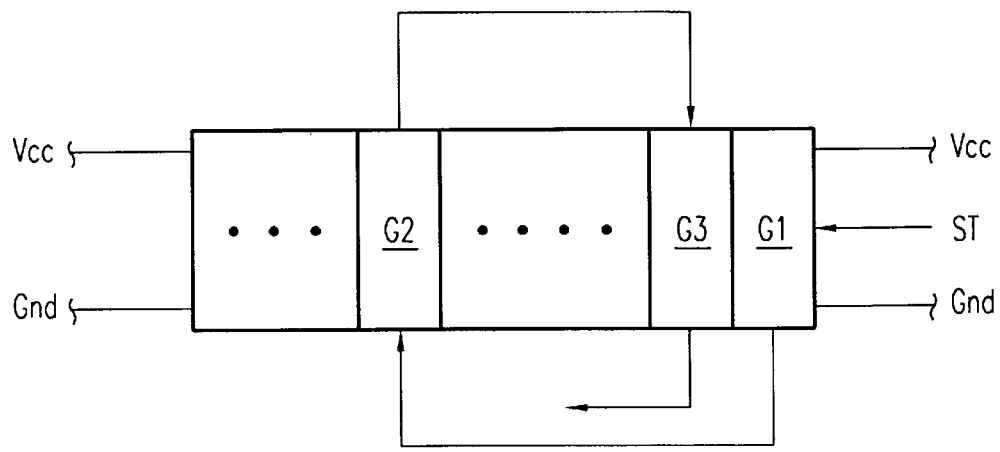
FIG. 3 is a diagram of the layout of the register device in FIG. 1 on a semiconductor substrate.
Figure 4:
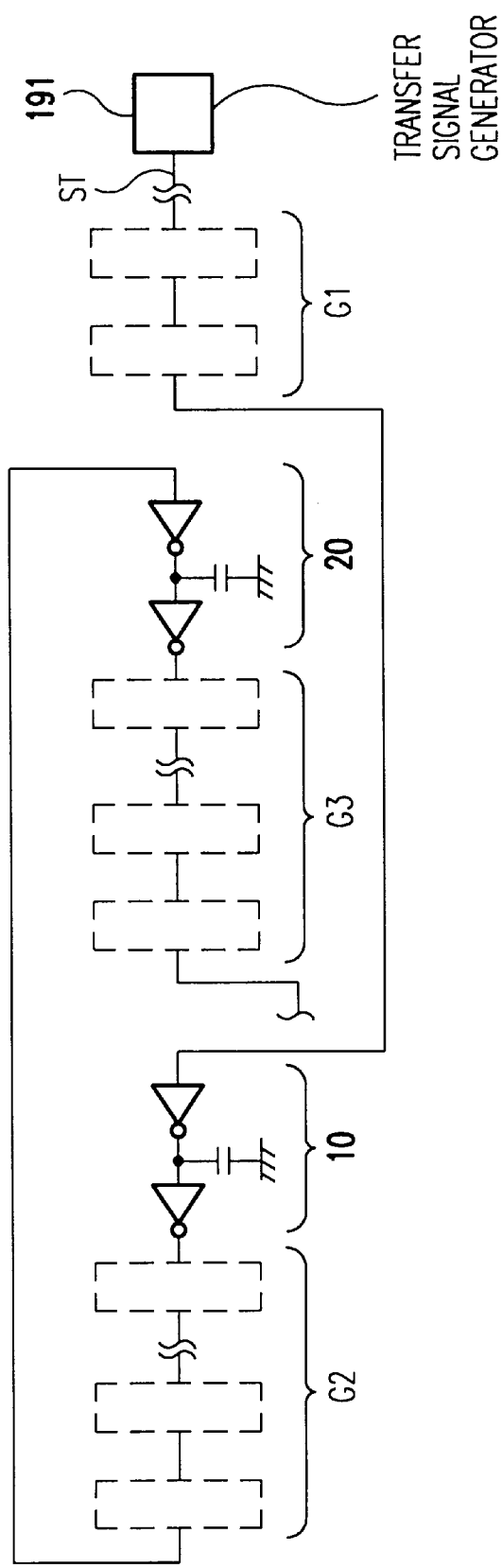
FIG. 4 is a block diagram of the circuit achieved by laying out the register device in FIG. 1 on a semiconductor substrate.

The register device 1 in the first embodiment is laid out on a semiconductor substrate as illustrated in FIG. 3. Namely, the sub-register device group G2 to which the transfer signal ST is communicated after it has been transmitted to the sub-register device group G1 is distanced from the sub-register device group G1 by the sub-register device group G3 and other sub-register device groups. Now, FIG. 4 shows a circuit block diagram of the register device 1 adopting this layout. In this layout, even when the data transfer operation from the write register units to the read register units at the sub-register device group G1 and the data transfer operation from the write register units to the read register units at the sub-register device group G2 overlap each other in time, the degree to which these operations electrically affect each other can be reduced. For instance, even if, during a data transfer operation at the sub-register device group G1, a fluctuation in the source voltage which is attributable to the operation, occurs, the degree to which the source voltage fluctuation affects the sub-register device group G2 is lessened by the presence of the sub-register device group G3 and other sub-register device groups. As a result, the sub-register device group G2 can perform data transfer operation in a stable manner.

Figure 5:
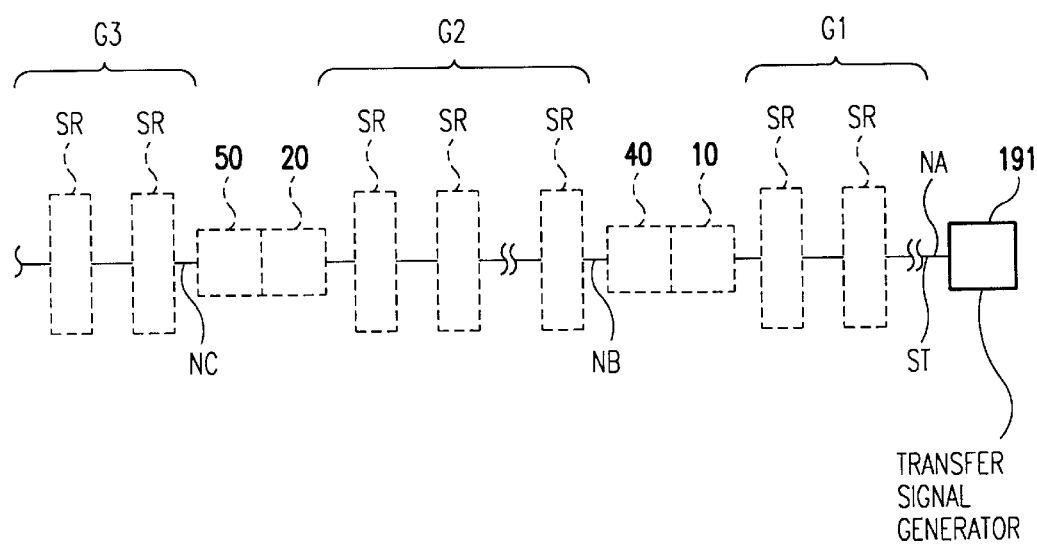
FIG. 5 is a circuit block diagram illustrating the structure of the register device in a second embodiment of the present invention.

The structure of a register device 31 in the second embodiment is illustrated in FIG. 5. This register device 31 is constituted by adding pulse signal generators 40 and 50 to the register device 1 in the first embodiment explained above.

Figure 6:
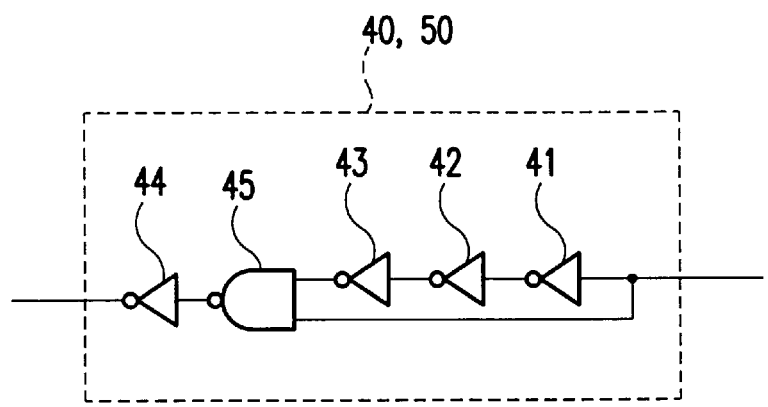
FIG. 6 is a circuit diagram illustrating the pulse signal generator provided in the register device illustrated in FIG. 5.

The pulse signal generators 40 and 50 in the second embodiment have circuit structures practically identical to each other. Namely, the pulse signal generators 40 and 50 are each provided with four inverters 41, 42, 43 and 44 and a NAND gate 45 as illustrated in FIG. 6. The output of the inverter 41 is connected to the input of the inverter 42, whereas the output of the inverter 42 is connected to the input of the inverter 43. One of the inputs of the NAND gate 45 is connected with the output of the inverter 43, with another input of the NAND gate 45 connected to the input of the inverter 41. The output of the NAND gate 45 is connected to the input of the inverter 44.

Figure 7:
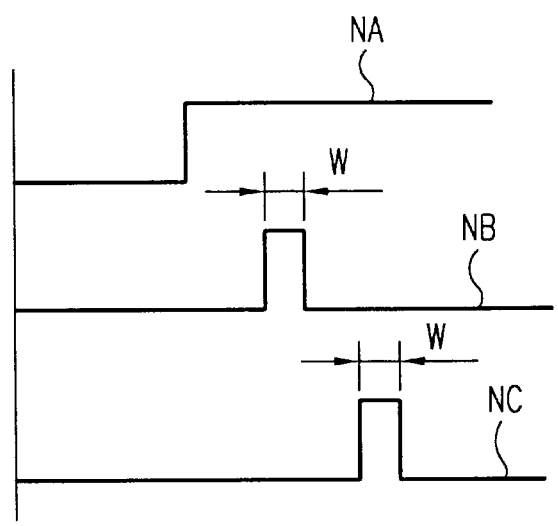
FIG. 7 is a waveform diagram illustrating the operation of the register device in FIG. 5.
Figure 8:
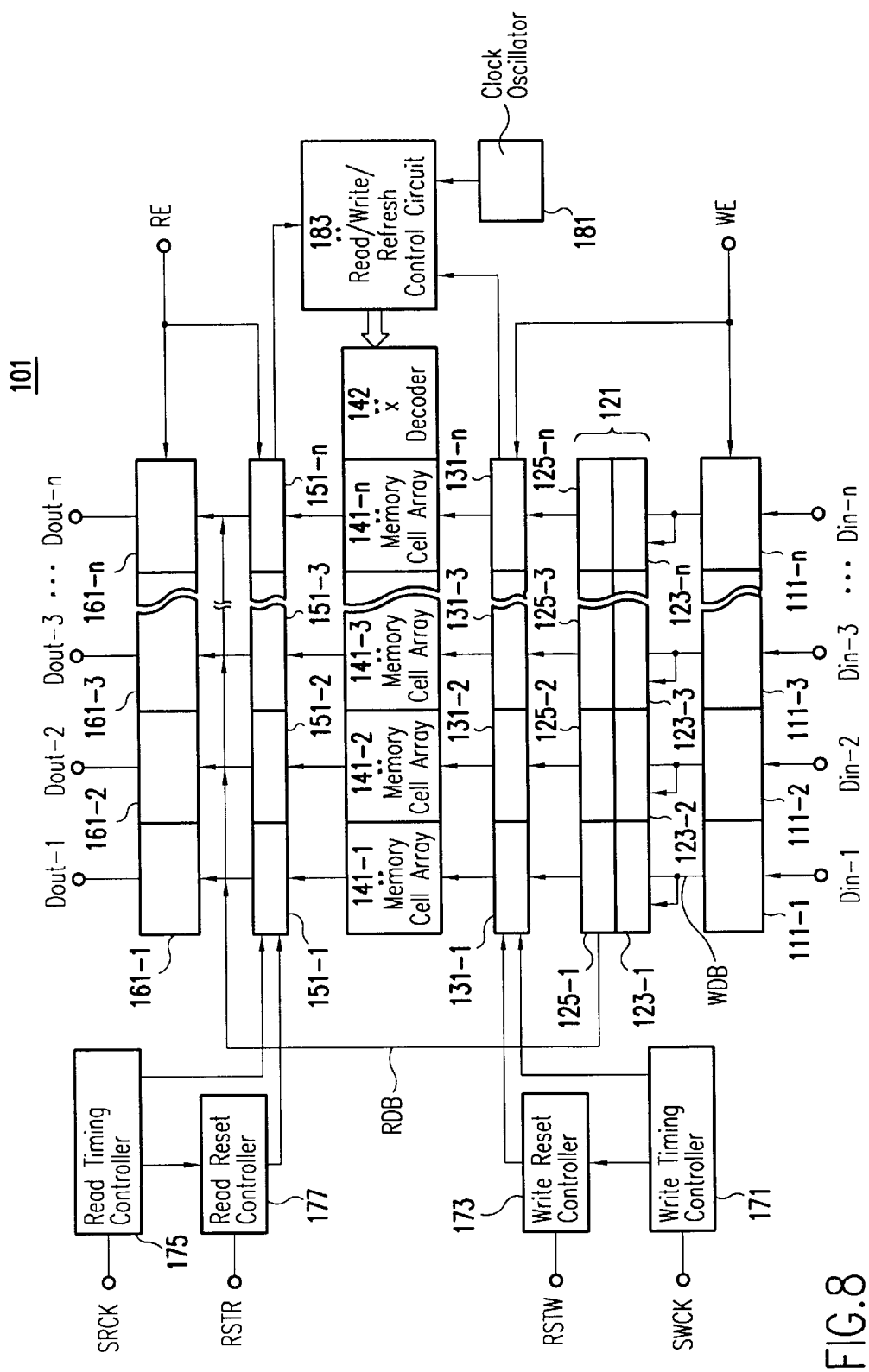
FIG. 8 is a block diagram illustrating the structure of a FIFO memory having a register device of the prior art.
Figure 9:
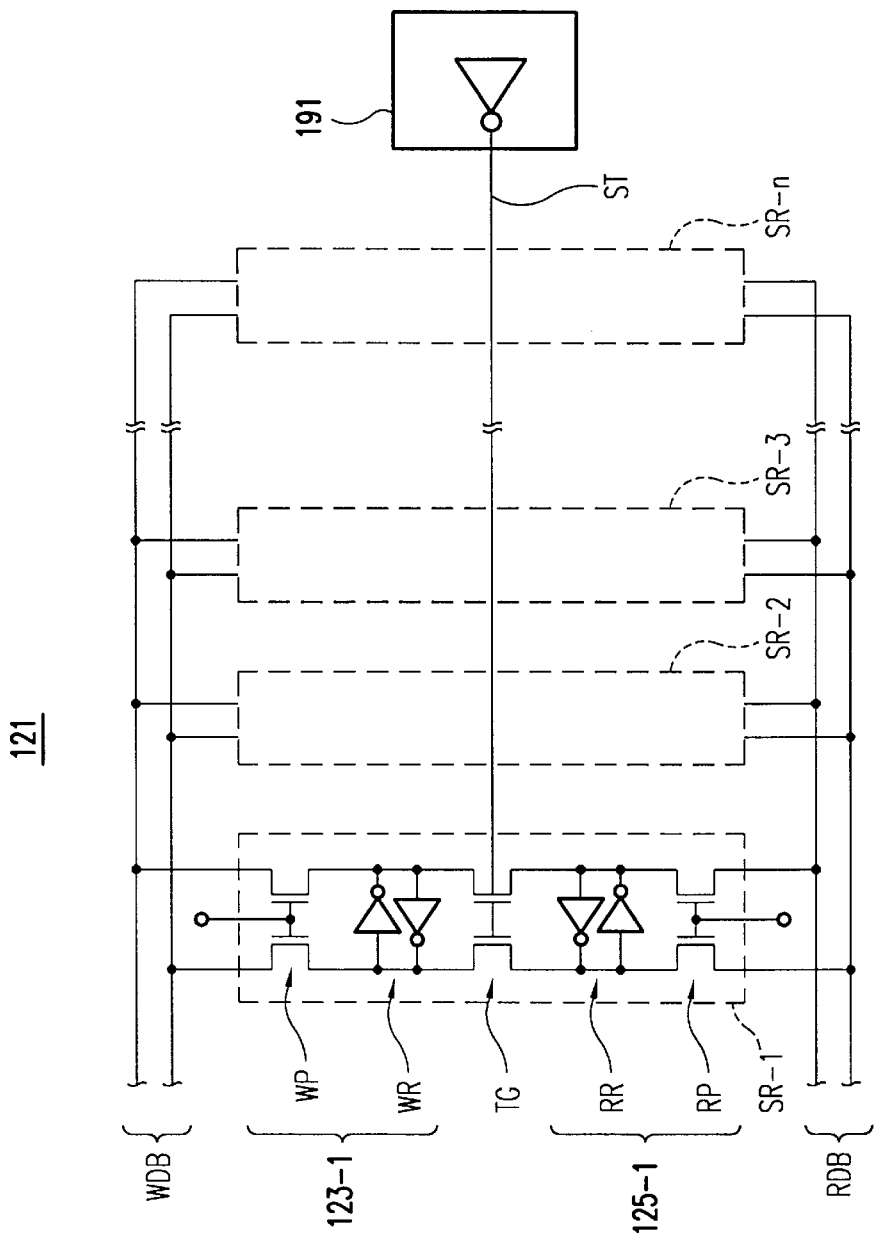
FIG. 9 is a circuit block diagram illustrating the structure of the register device in the prior art.
Figure 10:
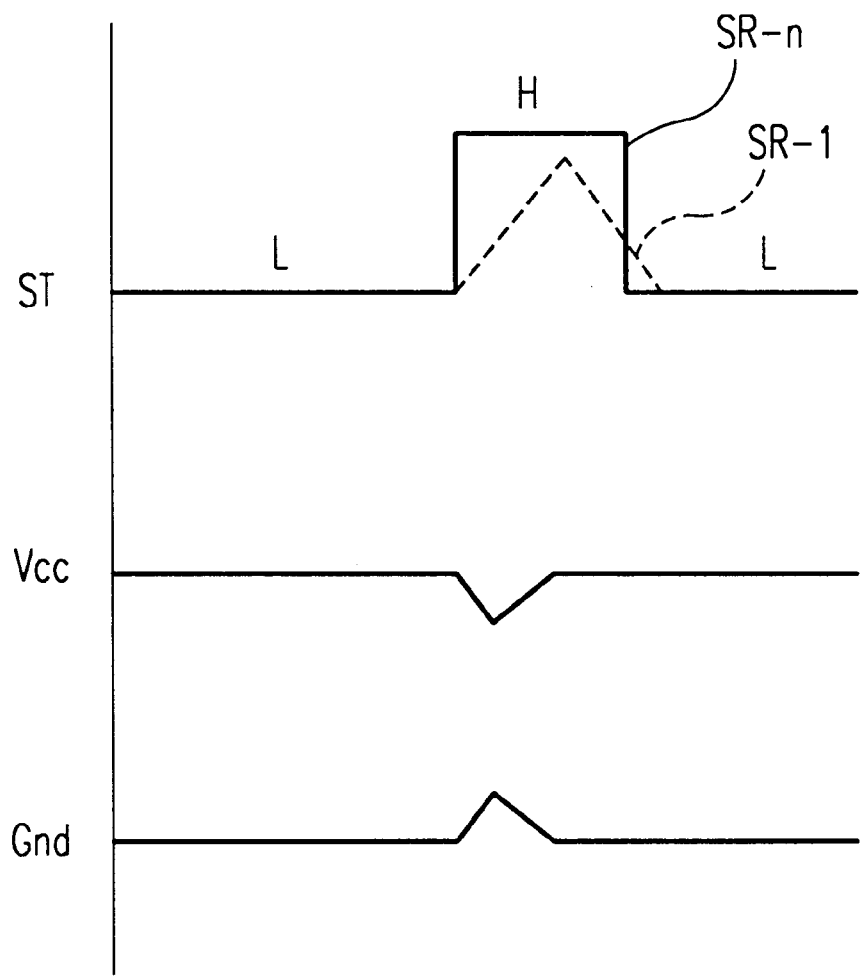
FIG. 10 is a waveform diagram illustrating the operation of the register device in FIG. 9.

Next, the operation of the register device 31 in the second embodiment is explained in reference to FIG. 7.

When the transfer signal ST output by the transfer signal generating unit 191 is at L level, the data transfer gates TG provided at the individual sub-register devices SR are in an OFF state and the data stored at the write register units are held instead of being transferred to the read register units.

At this point, the transfer signal ST shifts to H-level and is input to the sub-register device group G1 located closest to the transfer signal generating unit 191 via a node NA. Thus, the data transfer gates TG of the sub-register devices SR constituting the sub-register device group G1 are turned on, to cause the data to be transferred from the write register units to the read register units.

Next, the transfer signal ST at H-level is communicated to the signal processing unit 10. At the signal processing unit 10, which is provided with the capacitative element 15, the transfer signal ST that has been input is delayed by a specific length of time by the capacitative element 15 and then is communicated to the pulse signal generators 40, where the transfer signal ST is adjusted to become a pulse having a width W to be communicated to a node NB. The transfer signal ST at the node NB is then input to the sub-register device group G2. Thus, the data transfer gates TG of the sub-register devices SR constituting the sub-register device group G2 are turned on to cause data to be transferred from the write register units to the read register units.

The transfer signal ST that has been communicated to the sub-register device group G2 is next input to the signal processing unit 20 where it is delayed by a specific length of time as at the signal processing unit 10 described earlier and then is communicated to the pulse signal generator 50. At the pulse signal generator 50, the transfer signal ST is again adjusted to the pulse width W to be communicated to a node NC. The transfer signal ST at the node NC is then input to the sub-register device group G3, and subsequently as the same procedure is repeated so that the transfer signal ST is sequentially communicated until it reaches the sub-register device SR located at the last stage.

As explained above, the register device 31 in the second embodiment, which is constituted by adding the pulse signal generators between the sub-register device groups G1 and G2 and between the sub-register device groups G2 and G3 for adjusting the transfer signal ST to a specific pulse width to the structure of the register device 1 in the first embodiment described earlier, achieves the following additional advantages as well as the same advantages achieved by the register device 1. Namely, the pulse signal generators 40 and 50 facilitates the adjustment of the ON-time of the data transfer gates TG. Consequently, the data transfer gates TG in the individual sub-register devices can be set in an ON state only for the minimum length of time that is required for data transfer from the write register units to the read register units. Thus, the superfluous operation of the data transfer gates TG that remain in an ON state even after the data transfer from the write register units to the read register units is completed in the prior art can be eliminated to achieve a reduction in the power consumption of the entire register device 31.

In addition, as in the case of the register device 1 in the first embodiment, the register device 31 in the second embodiment is laid out at a semiconductor substrate as illustrated in FIG. 3. By adopting this layout, the individual sub-register device groups can perform stable data transfer operations while keeping the extent to which they affect each other to the minimum.

While the invention has been particularly shown and described with respect to preferred embodiments thereof by referring to the attached drawings, the present invention is not limited to these examples and it will be understood by those skilled in the art that various changes in form and detail may be made therein without departing from the spirit, scope and teaching of the invention, and that these changes and modifications fall in the technical scope of the invention.

For instance, while the three sub-register device groups G1, G2 and G3 are provided in the embodiments explained above, the number of sub-register device groups is not restricted to three.

In addition, while the explanation has been given on the write register WR and the read register RR provided at each sub-register device that are each constituted as an inverter latch, the present invention is not restricted to this structure and they may have any structure as long as they are constituted as elements having a latch function.

Furthermore, while the pulse signal generators 40 and 50 are each constituted of the inverters 41 through 44 and the NAND gate 45, the number of inverters may be increased to increase the pulse width. In addition, a monostable multivibrator or the like may be employed to constitute a pulse signal generator. Moreover, while the explanation has been given on a case in which the pulse signal generators 40 and 50 are constituted as practically identical circuits that generate pulse signals with the same pulse widths, the pulse widths of the pulse signals generated by them may be individually adjusted instead.

As has been explained, according to the present invention, the data transfer from the first register units to the second register units at all the sub-register devices can be performed accurately with error-free operation.

In addition, according to the present invention as disclosed, the power consumption can be reduced. Furthermore, according to the present invention as disclosed, a plurality of sub-register devices can be operated with a high degree of efficiency and according to the present invention as disclosed, the operations of the sub-register devices can be stabilized.

The entire disclosure of Japanese Patent Application No. 10-46216 filed on Feb. 10, 1998 including specification, claims, drawings and summary is incorporated herein by reference in its entirety.

What is claimed is:

1. A register device comprising:

a plurality of sub-register devices each including a first register unit, a second register unit and a data transfer unit, data held at said first register unit being transferred to said second register unit by said data transfer unit responsive to a transfer signal, each of said plurality of sub-register devices being coupled to respectively different input data;

a transmission path that is coupled to said data transfer units;

a transfer signal generating unit that generates the transfer signal and outputs the transfer signal to said transmission path; and at least one signal processing unit provided at one or more locations along said transmission path between said plurality of sub-register devices, said at least one processing unit amplifying the transfer signal.

2. The register device according to claim 1, wherein said at least one signal processing unit comprises a delay element that delays the transfer signal by a specific length of time.

3. The register device according to claim 1, wherein said at least one signal processing unit comprises a pulse signal generator that changes a pulse width of the transfer signal.

4. The register device according to claim 1, wherein said plurality of sub-register devices are grouped into a plurality of sub-register device groups, said transmission path sequentially providing the transfer signal to said plurality of sub-register device groups one at a time.

5. The register device according to claim 4, wherein said plurality of sub-register device groups are positioned so that the transfer signal is not always transmitted simultaneously to adjacent sub-register device groups.

6. The register device of claim 4, wherein said plurality of sub-register device groups are positioned so that the transfer signal is transmitted sequentially to nonadjacent sub-register device groups.

7. A register device comprising:

a plurality of sub-register devices each including a first register unit, a second register unit and a data transfer unit, data held at said first register unit being transferred to said second register unit by said data transfer unit responsive to a transfer signal;

a transmission path that is coupled to said data transfer units;

a transfer signal generating unit that generates the transfer signal and outputs the transfer signal to said transmission path; and at least one signal processing unit provided at one or more locations along said transmission path between said plurality of sub-register devices, said at least one signal processing unit including a delay element that delays the transfer signal by a specific length of time.

8. The register device of claim 7, wherein said at least one signal processing unit further comprises an amplifier that amplifies the transfer signal.

9. The register device of claim 7, wherein said at least one signal processing unit further comprises a pulse signal generator that changes a pulse width of the transfer signal.

10. A register device comprising:

a plurality of sub-register devices each including a first register unit, a second register unit and a data transfer unit, data held at said first register unit being transferred to said second register unit by said data transfer unit responsive to a transfer signal;

a transmission path that is coupled to said data transfer units;

a transfer signal generating unit that generates the transfer signal and outputs the transfer signal to said transmission path; and at least one signal processing unit provided at one or more locations along said transmission path between said plurality of sub-register devices, said signal processing unit including a pulse signal generator that changes a pulse width of the transfer signal.

11. The register device of claim 10, wherein said at least one signal processing unit further comprises an amplifier that amplifies the transfer signal.

12. A register device comprising:

a plurality of sub-register devices each including a first register unit, a second register unit and a data transfer unit, data held at said first register unit being transferred to said second register unit by said data transfer unit responsive to a transfer signal;

a transmission path that is coupled to said data transfer units;

a transfer signal generating unit that generates the transfer signal and outputs the transfer signal to said transmission path; and at least one signal processing unit provided at one or more locations along said transmission path between said plurality of sub-register devices, said plurality of sub-register devices being grouped into a plurality of sub-register device groups, said transmission path sequentially providing the transfer signal to said plurality of sub-register device groups one at a time, said plurality of sub-register device groups being positioned so that the transfer signal is transmitted sequentially to non-adjacent sub-register device groups.

13. The register device of claim 12, wherein said at least one signal processing unit further comprises an amplifier that amplifies the transfer signal.

14. The register device of claim 12, wherein said at least one signal processing unit further comprises a pulse signal generator that changes a pulse width of the transfer signal.

15. The register device of claim 12, wherein said at least one signal processing unit further comprises a delay element that delays the transfer signal by a specific length of time.

* * * * *